US011520236B2

(12) United States Patent
Dunphy et al.

(10) Patent No.: US 11,520,236 B2
(45) Date of Patent: Dec. 6, 2022

(54) NON-TELECENTRIC LIGHT GUIDE ELEMENTS

(71) Applicant: Waymo LLC, Mountain View, CA (US)

(72) Inventors: James Dunphy, San Jose, CA (US); David Hutchison, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 17/474,779

(22) Filed: Sep. 14, 2021

(65) Prior Publication Data
US 2021/0405536 A1 Dec. 30, 2021

Related U.S. Application Data

(62) Division of application No. 16/666,952, filed on Oct. 29, 2019, now Pat. No. 11,131,934.

(51) Int. Cl.
*G03F 7/20* (2006.01)
*G02B 6/42* (2006.01)
(52) U.S. Cl.
CPC ........... *G03F 7/702* (2013.01); *G02B 6/4214* (2013.01)
(58) Field of Classification Search
CPC ................. G01S 7/4814; G01S 7/4818; G02B 2006/12173; G02B 6/138; G02B 6/4214; G03F 7/702
See application file for complete search history.

(56) References Cited

U.S. PATENT DOCUMENTS 4,560,249 A 12/1985 Nishiwaki et al.
4,842,405 A 6/1989 El-Sherif
(Continued)

FOREIGN PATENT DOCUMENTS

CN 101047111 A * 10/2007 ......... G02B 27/0911
CN 100403082 C * 7/2008 ......... G02B 6/12002
(Continued)

OTHER PUBLICATIONS

Bagal et al., "Fabrication of a subwavelength periodic nanostructures using liquid immersion Lloyd's mirror interference lithography," Optics Letters, Jul. 2013, pp. 2531-2534, vol. 38, No. 14.
(Continued)

*Primary Examiner* — Peter B Kim
(74) *Attorney, Agent, or Firm* — McDonnell Boehnen Hulbert & Berghoff LLP

(57) ABSTRACT

The present disclosure relates to systems and methods relating to the fabrication of light guide elements. An example system includes an optical component configured to direct light emitted by a light source to illuminate a photoresist material at one or more desired angles so as to expose an angled structure in the photoresist material. The photoresist material overlays at least a portion of a first surface of a substrate. The optical component includes a container containing a light-coupling material that is selected based in part on the one or more desired angles. The system also includes a reflective surface arranged to reflect at least a first portion of the emitted light to illuminate the photoresist material at the one or more desired angles.

20 Claims, 13 Drawing Sheets

(56) References Cited

U.S. PATENT DOCUMENTS

| | | | |
|---|---|---|---|
| 5,263,111 A | 11/1993 | Nurse et al. | |
| 5,363,220 A | 11/1994 | Kuwayama et al. | |
| 5,879,866 A | 3/1999 | Starikov et al. | |
| 6,510,263 B1 | 1/2003 | Maisenholder et al. | |
| 6,608,722 B2 | 8/2003 | Cowan et al. | |
| 6,727,046 B1 | 4/2004 | Bryan-Brown et al. | |
| 6,743,554 B2 | 6/2004 | Nakao | |
| 6,882,477 B1 | 4/2005 | Schattenburg et al. | |
| 6,917,456 B2 | 7/2005 | Reboa et al. | |
| 7,253,425 B2 | 8/2007 | Livesay et al. | |
| 7,932,020 B2 | 4/2011 | Pierrat et al. | |
| 8,546,048 B2 | 10/2013 | Riege | |
| 9,329,326 B2 | 5/2016 | Marttila et al. | |
| 9,360,615 B1 | 6/2016 | Jalava | |
| 10,534,143 B1 | 1/2020 | Droz et al. | |
| 10,707,195 B2 | 7/2020 | Last et al. | |
| 2004/0234224 A1 | 11/2004 | Ishizaki et al. | |
| 2005/0036121 A1 | 2/2005 | Hoogendam et al. | |
| 2008/0117396 A1 | 5/2008 | Hori | |
| 2010/0195082 A1 | 8/2010 | Yoon et al. | |
| 2011/0091813 A1 | 4/2011 | Lai et al. | |
| 2013/0003035 A1 | 1/2013 | Chang et al. | |
| 2013/0243376 A1* | 9/2013 | Choraku | G02B 6/4214 385/31 |
| 2014/0055861 A1 | 2/2014 | Li et al. | |
| 2015/0049314 A1 | 2/2015 | Fukazawa | |
| 2015/0338718 A1 | 11/2015 | Zhang et al. | |
| 2016/0018610 A1* | 1/2016 | Krishnamurthi | G02B 6/132 438/31 |
| 2018/0113385 A1 | 4/2018 | Yang et al. | |
| 2018/0261972 A1 | 9/2018 | Filgas et al. | |
| 2019/0072649 A1 | 3/2019 | Droz et al. | |
| 2020/0142312 A1 | 5/2020 | Dunphy et al. | |

FOREIGN PATENT DOCUMENTS

| | | | | |
|---|---|---|---|---|
| CN | 109154661 A | * | 1/2019 | ............. G01S 17/10 |
| JP | 56-150703 | | 11/1981 | |
| JP | 60-007405 | | 1/1985 | |
| JP | 63-250602 | | 10/1988 | |
| JP | 02-067559 | | 3/1990 | |
| JP | 04-100082 | | 4/1992 | |
| JP | 04-113383 | | 4/1992 | |
| JP | 06-067607 | | 3/1994 | |
| JP | 2000117465 A | * | 4/2000 | ............. B23K 26/08 |
| JP | 2001-006175 | | 1/2001 | |
| JP | 2004054003 A | * | 2/2004 | ............... G02B 6/42 |
| JP | 2004-133300 | | 4/2004 | |
| JP | 2005-129894 | | 5/2005 | |
| JP | 2005-250021 | | 9/2005 | |
| JP | 2006-056145 | | 3/2006 | |
| JP | 2010-014811 | | 1/2010 | |
| JP | 2011-253151 | | 12/2011 | |
| JP | 2012-068297 | | 4/2012 | |
| JP | 2012-220919 | | 11/2012 | |
| TW | 201206006 | | 4/2012 | |

OTHER PUBLICATIONS

Tsang, W.T., "Theoretical modeling of the simultaneous exposure and development of (SED) process of a positive resist," Applied Optics, Jul. 1977, pp. 1918-1930, vol. 16, No. 7.

Taiwan Patent Office, Office Action dated Jul. 14, 2021, issued in connection with ROC (Taiwan) Patent Application No. 109136105, 7 pages.

* cited by examiner

Oblique View of Light Input Side

Top View

Side View

NON-TELECENTRIC LIGHT GUIDE ELEMENTS

CROSS-REFERENCE TO RELATED APPLICATION

The present application is a divisional of U.S. patent application Ser. No. 16/666,952, filed Oct. 29, 2019, the content of which is herewith incorporated by reference.

BACKGROUND

Light guiding devices may include optical fibers, waveguides, and other optical elements (e.g., lenses, mirrors, prisms, etc.). Such light guiding devices may transmit light from an input facet to an output facet via total or partial internal reflection. Furthermore, light guiding devices may include active and passive optical components, such as optical switches, combiners, and splitters.

Optical systems may utilize light guiding devices for a variety of purposes. For example, optical fibers may be implemented to transmit optical signals from a light source to a desired location. In the case of light detection and ranging (LIDAR) devices, a plurality of light sources may emit light, which may be optically coupled to the light guiding devices so as to be directed into a given environment. The light emitted into the environment may be detected by a receiver of the LIDAR devices so as to provide estimated distances to objects in the environment.

SUMMARY

The present disclosure relates to systems and methods of manufacture relating to light guiding elements configured to be mounted in a non-telecentric arrangement within an optical system. Additionally or alternatively, systems and methods described herein could be applicable to the manufacture of optical systems. For example, the present disclosure describes certain optical elements (e.g., light guide devices) and methods for their manufacture. The optical waveguides may include one or more structures such as mirrored surfaces, vertical structures, and/or angled structures.

In a first aspect, a system is provided. The system includes an optical component configured to direct light emitted by a light source to illuminate a photoresist material at one or more desired angles so as to expose an angled structure in the photoresist material. The photoresist material overlays at least a portion of a first surface of a substrate. The optical component includes a container containing a light-coupling material that is selected based in part on the one or more desired angles. The system also includes a reflective surface arranged to reflect at least a first portion of the emitted light to illuminate the photoresist material at the one or more desired angles.

In a second aspect, an optical system is provided. The optical system includes a substrate and a light-emitter device. The optical system also includes an optical waveguide arranged along a surface of the substrate. The optical waveguide includes a mirror portion. The optical waveguide is configured to guide light emitted by the light-emitter device. A portion of the guided light interacts with the mirror portion so as to direct reflected light into an environment of the optical system. The mirror portion includes a reflective surface arranged between 30 degrees and 60 degrees with respect to the substrate.

In a third aspect, a method is provided. The method includes placing a substrate near one end of an optical component. The photoresist material overlays at least a portion of a first surface of the substrate. The optical component includes: (i) a container containing a light-coupling material, and (ii) a reflective surface. The method also includes causing a light source to emit light into the optical component. The reflective surface reflects at least a first portion of the emitted light to illuminate the photoresist material at one or more desired angles, thereby exposing at least a portion of an angled structure in the photoresist material.

Other aspects, embodiments, and implementations will become apparent to those of ordinary skill in the art by reading the following detailed description, with reference where appropriate to the accompanying drawings.

DETAILED DESCRIPTION

Figure 1:
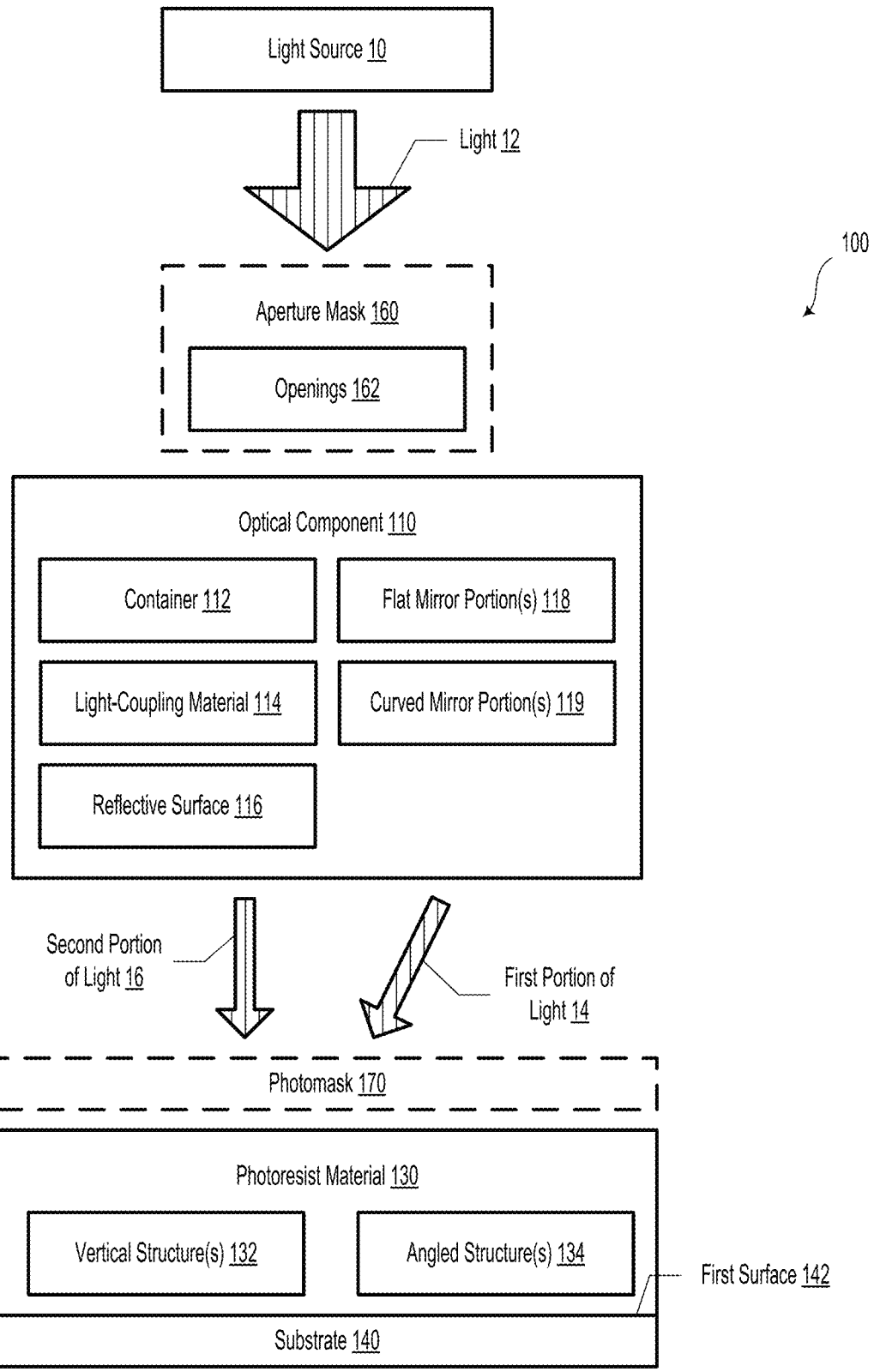
FIG. 1 illustrates a system, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Light guides may include optical elements that may be configured to guide light within the light guides. These optical elements may include structures that may reflect light (totally or partially) in order to transmit light from an input facet to an output facet of the light guide. For example, the optical elements may be vertical and/or angled structures that may guide light. More specifically, a vertical structure may guide light along a length of the structure. An angled structure may be coated with a metal that is optically reflective, thereby effectively functioning as a mirror that may reflect incident light in a particular direction.

In an example embodiment, light guides may be formed from a photoresist material and may be configured to guide infrared light.

In practice, light guides may be fabricated using photolithography, which uses a light source to expose structures of the optical elements in a photoresist material that overlays a substrate. The desired structures may be exposed by exposure light that illuminates the photoresist with a photomask pattern. In such scenarios, vertical structures are exposed by exposure light that is normally incident on the photoresist material so as to expose the photoresist at a normal angle.

On the other hand, angled structures are exposed by exposure light that is incident on the photoresist material at a non-normal angle. For example, to expose an angled structure, a refractive angle of the light in the photoresist material is set at a desired angle of the angled structure. However, achieving some refractive angles in the photoresist material can be challenging. For instance, when a medium between the light source and the photoresist material is air, the refractive angle in the photoresist material to expose some angled structures may not be achievable according to Snell's law.

One current solution is to use immersion photolithography to achieve the desired refractive angles in the photoresist material. In this solution, the substrate may be immersed in a medium that has a moderate refractive index. The material is chosen to have an index high enough to transmit light that refracts to the designed angles in the photoresist material according to Snell's law. To expose angled structures in the immersed photoresist material, a robotic device moves a light source at specific angles with respect to the photoresist material to expose the photoresist material at the desired angles. Although this solution may be used to fabricate angled structures, it is inefficient and time-consuming. In practice, fabricating optical elements using such a technique may take several hours.

Disclosed herein are immersion lithography systems and methods that could include an optical component configured to direct light from a light source to illuminate a photoresist material on a substrate at a plurality of desired angles and thereby expose a plurality of variously-angled structures in the photoresist material. The optical component may include a container containing an index-matching material (e.g., water or another fluid) that is selected based in part on the desired angles. The optical component may also include a reflective surface arranged to reflect at least a portion of the light to illuminate the photoresist material at the desired angles.

In an example embodiment, the reflective surface includes a plurality of different angles that can form the plurality of desired angles in the photoresist material. In such scenarios, the angled structures can be formed with different controllable angles, which are determined based on a shape of the reflective surface.

In some embodiments, the angled structures could be coated with a reflective material so as to form angled mirror structures. The angled mirror structures could be optically coupled to a respective plurality of light guides (e.g., optical waveguides). A plurality of light emitter devices could be configured to emit respective light pulses along the light guides. The light pulses could be guided along the light guides and reflected out-of-plane by the angled mirror structures. In such scenarios, the light pulses could be emitted into an environment at different angles.

A LIDAR system could include a plurality of light emitter devices and a light guide manifold. The light guide manifold could include a plurality of waveguides corresponding, and optically-coupled, to the respective light emitter devices. The plurality of light emitter devices could be configured to emit light pulses along the respective waveguides. The light guide manifold may also include a plurality of angled mirror structures optically coupled to the waveguides. In an example embodiment, the plurality of angled mirror structures could be configured to direct the light pulses out of the plane of the waveguides and toward an environment of the LIDAR. Furthermore, the respective angle of the angled mirror structures could be different so that the light pulses are controllably directed along different emission angles toward the environment. For example, the angled mirror structures could be arranged at 42 degrees, 45 degrees, and 48 degrees with respect to the plane of the waveguides. However, other angles and/or angle ranges are contemplated and possible.

II. Example Systems

In line with the discussion above, some desired structures can be challenging to fabricate using current photolithography systems. For instance, fabricating some angled structures may not be feasible when the medium between the light source and the photoresist material is air. Specifically, according to Snell's law, the angles of refraction in the photoresist material to expose the angled structures may not be achievable when the medium between the light source and the photoresist material is air.

Disclosed herein are methods and systems for fabricating optical elements (e.g., optical waveguides). In particular, the methods and systems may be used to fabricate optical elements that include desired structures (e.g., desired angled and/or vertical structures). Further, the methods and systems disclosed herein may fabricate optical elements more rapidly and efficiently than fabrication systems currently used in practice.

FIG. 1 illustrates a system 100, according to an example embodiment. The system 100 may be a photolithography system that may be configured to fabricate optical elements by exposing desired structures in a photo-patternable material. Furthermore, the system 100 could be utilized in the context of optical immersion lithography. In such scenarios, the system 100 could be used to form angled structures at desired angles in a photoresist material.

The system 100 includes an optical component 110 configured to direct light 12 emitted by a light source 10 to illuminate a photoresist material 130 at one or more desired angles so as to expose an angled structure 134 in the photoresist material 130. As explained herein, the optical component 110 may be configured to manipulate light emitted by the light source 10 in order to expose the desired structures in the photoresist material 130.

In such embodiments, the photoresist material 130 overlays at least a portion of a first surface 142 of a substrate 140. For example, the photoresist material 130 may include SU-8 polymer, Kloe K-CL negative photoresist, Dow PHOTOPOSIT negative photoresist, or JSR negative tone THB photoresist. It will be understood that the photoresist material 130 may be include other polymeric photo-patternable materials.

The substrate 140 may be a transparent substrate such as glass and/or another material that is substantially transparent to a desired wavelength range (e.g., near infrared wavelengths or another infrared wavelength range).

In some embodiments, the light source 10 may be configured to emit one or more wavelengths of light. For instance, the light source 10 may be configured to emit visible light and/or ultraviolet (UV) light. Furthermore, the light source 10 may include one or more components (e.g., a lens and/or a collimator) that may enable the light source 10 to emit collimated or substantially collimated light. For instance, the light may be collimated using anisotropic collimation. In such scenarios, the light source 10 could be an anisotropic collimated light source.

In some embodiments, the light source 10 may emit p-polarized light in order to reduce reflections from the substrate-resist interface and from a back-side of the substrate 140. Accordingly, the light source 10 may include a polarizer (e.g., a polarization filter) that enables the light source 10 to emit p-polarized light. Additionally and/or alternatively, the light source 10 may include an integrated timer, which may allow the system 100 to control an exposure time. In an example implementation, the light source 10 may be a 500 Watt UV lamp source. In another example implementation, the light source 10 may be a 500 Watt collimated UV lamp source.

Additionally or alternatively, the light source 10 could be a mercury or xenon gas discharge lamp. In other embodiments, the light source 10 could be a deep ultraviolet (UV) excimer laser, such as a 193 nm ArF excimer laser. However, other light sources suitable for optical lithography and/or immersion lithography are possible and contemplated.

In an embodiment, the optical component 110 may be configured to manipulate the emitted light in order to expose the photoresist material 130. To manipulate the emitted light, the optical component 110 may be located in proximity of and optically coupled to the light source 10. In an implementation, the optical component 110 may be located above or beneath the light source 10, with respect to a level surface. Other orientations of the optical component 110 and the light source 10 are contemplated and possible.

The optical component 110 includes a container 112 containing a light-coupling material 114 that is selected based, in part, on the one or more desired angles. In an example embodiment, the light-coupling material 114 may include a liquid medium (e.g., purified water) that has a refractive index greater than one. In other examples, the light-coupling material 114 may be glycol (refractive index~1.43) and/or glycerol (refractive index~1.47), among other examples. In an example, the light-coupling material 114 may be any material that has a refractive index appropriate to support transmission of light rays which, after refraction, have the desired angle in the photoresist. Additionally or alternatively, the light-coupling material 114 may be a solid (e.g., clear acrylic and cured silicone or epoxy), liquid, adhesive, or gel that fills at least a portion of an interior of the container 112. However, other types of light-coupling materials common to immersion lithography are possible and considered herein.

In some embodiments, the container 112 may be made from one or more materials, such as aluminum and/or other types of metal. A portion of one surface of the container 112 may be transparent so that the light emitted by light source 10 may enter the container 112. A portion of another surface of the container 112 may also be transparent in order for light to exit the container 112 to expose the photoresist material 130. For example, portions of a top surface and a bottom surface of the container 112 may be transparent in order for light to enter/exit the container 112. Notably, the transparent portions may be transparent to the type of emitted light. For instance, when the emitted light is UV light, the transparent portions may be transparent to UV light. Example materials of the transparent portions may include glass and/or any other material that is transparent to the light emitted by light source 10.

The optical component 110 additionally includes a reflective surface 116 arranged to reflect at least a first portion of the light 14 to illuminate the photoresist material 130 at the one or more desired angles. In example embodiments, the reflective surface 116 may include a surface mirror, a concave mirror, a convex mirror, a prism, and/or a diffractive mirror. In some embodiments, the optical component 110 may include a plurality of reflective surfaces 116. In such scenarios, the reflective surfaces 116 may include mirrors of the same type, orientation, and/or characteristics.

In some embodiments, the one or more desired angles could include at least one of: 42 degrees, 45 degrees, and 48 degrees with respect to the first surface 142. In such a manner, the photoresist material 130 could be exposed with UV light and developed so as to form a plurality of angled structures 134. However, it will be understood that the angled structures 134 could have surfaces having other angles with respect to the first surface 142. For example, the one or more desired angles could include at least one angle selected from an angle range between 40 degrees and 60 degrees with respect to the first surface 142.

In some embodiments, the reflective surface 116 could include a plurality of flat mirror portions 118 corresponding to the one or more desired angles.

Additionally or alternatively, the reflective surface 116 could include one or more curved mirror portions 119.

In some embodiments, system 100 could further include an aperture mask 160 placed between the light source 10 and the substrate 140. The aperture mask 160 includes one or more openings 162, each opening corresponding to a respective desired structure (e.g., vertical structures 132 and/or angled structures 134) in the photoresist material 130. At least a portion of the emitted light that is transmitted through each opening exposes the respective desired structure to which the opening corresponds. As an example, the respective desired structure could include at least one vertical structure 132 and at least one angled structure 134.

In an embodiment, each of the openings 162 of the aperture mask 160 may correspond to a respective desired feature for exposure in the photoresist material 130. The aperture mask 160 may be used to define the approximate fields of different angles of exposure light by selectively allowing light to pass through the mask's openings. Each opening may allow a respective portion of light to pass through, which may then be used (directly or indirectly) to expose a particular feature in the photoresist material 130.

For example, the aperture mask 160 includes a first opening. In such scenarios, the first opening is configured to allow the first portion of the emitted light to interact with a first portion of the reflective surface 116. The first portion of the reflective surface 116 is configured to redirect the first portion of the emitted light 14 to expose the at least one angled structure 134.

In some embodiments, the aperture mask 160 includes a second opening. In such scenarios, the second opening is configured to allow a second portion of the emitted light 16 to expose the at least one vertical structure 132.

In various embodiments, the aperture mask 160 could include one or more neutral density filters configured to reflect and/or absorb light so as to balance the light intensity incident onto the normal and angled field regions of the photoresist material 130. One such neutral density filter could include incorporating a pattern of small opaque and/or clear circles on the opposite background (e.g., a polka dot pattern) to the aperture mask 160. In such a scenario, the light transmitted through such a neutral density filter may be uniformly attenuated upon interaction with the photoresist material 130. Additionally, due to diffraction, the light could be slightly blurred. The input light to the system is not collimated perfectly and may have an angular range of 1-2 degrees. Accordingly, the dot pattern may be blurred into a uniform intensity at a sufficient "throw" distance, approximately the dot period divided by the tangent of the angular range. In some embodiments, for a fine pattern under 1 mm period, the blurring may occur over substantially the entire width of the optics box (e.g., 50 mm). Accordingly, light transmitted through the neutral density filter region could be substantially blurred so as to form a uniform illumination intensity at the photoresist material 130.

In example embodiments, at least a portion of a first surface and at least a portion of a second surface of the container 112 are transparent. In such scenarios, the emitted light 12 enters the container 112 through the transparent portion of the first surface, and wherein the emitted light illuminates the photoresist material 130 through the transparent portion of the second surface.

In various embodiments, system 100 could include a photomask 170. In some embodiments, the photomask 170 is arranged in proximity to the photoresist material 130. The photomask 170 is configured to define individual desired structures in the photoresist material 130.

In various embodiments, the photomask 170 may be located near the substrate 140, perhaps placed above the photoresist material 130. In an embodiment, the photomask 170 may be used to define individual structures in the photoresist material 130. In particular, the photomask 170 may include a pattern of openings or transparencies that allow exposure light to transmit through to the photoresist material 130. In an embodiment, the pattern may correspond to a desired arrangement of optical waveguides or other structures formed from the photoresist material 130. That is, the photomask 170 may include openings that correspond to vertical structures 132 and/or angled structures 134. When the substrate 140 is exposed with light, the light that is transmitted through an opening that corresponds to a vertical structure creates a vertical structure in the photoresist material 130, and the light that is transmitted through an opening that corresponds to an angled structure may create an angled structure 134 in the photoresist material 130 (upon photoresist bake and/or development processes). As explained herein, light that is reflected from the reflective surface 116 may be transmitted through the openings of the photomask 170 that correspond to the angled structures 134.

In some embodiments, the optical component 110 further includes a device configured to remove stray light within the optical component 110. For example, the optical component 110 could include a light baffle or another type of light-noise-mitigating structure and/or material.

In various examples, an optical absorber could be disposed behind the substrate 140 (e.g., along a surface opposite the photoresist material 130). The optical absorber may be configured to prevent backscattered light from causing spurious patterns in the photoresist material 130. The optical absorber could include a coating on the back of the substrate 140. Alternatively, the optical absorber could be a dark or opaque material that is separate from the substrate 140. For example, an optical coupling material (e.g., the light-coupling material 114) could be disposed between the back of the substrate 140 and the optical absorber.

In some embodiments, the substrate 140 could be immersed in the light-coupling material 114 such that the photoresist material 130 is facing a second surface of the container 112. At least a portion of the second surface of the container 112 is transparent. In such a scenario, the emitted light 12 from the light source 10 enters the container 112 through the transparent portion of the second surface of the container 112.

Figure 2A:
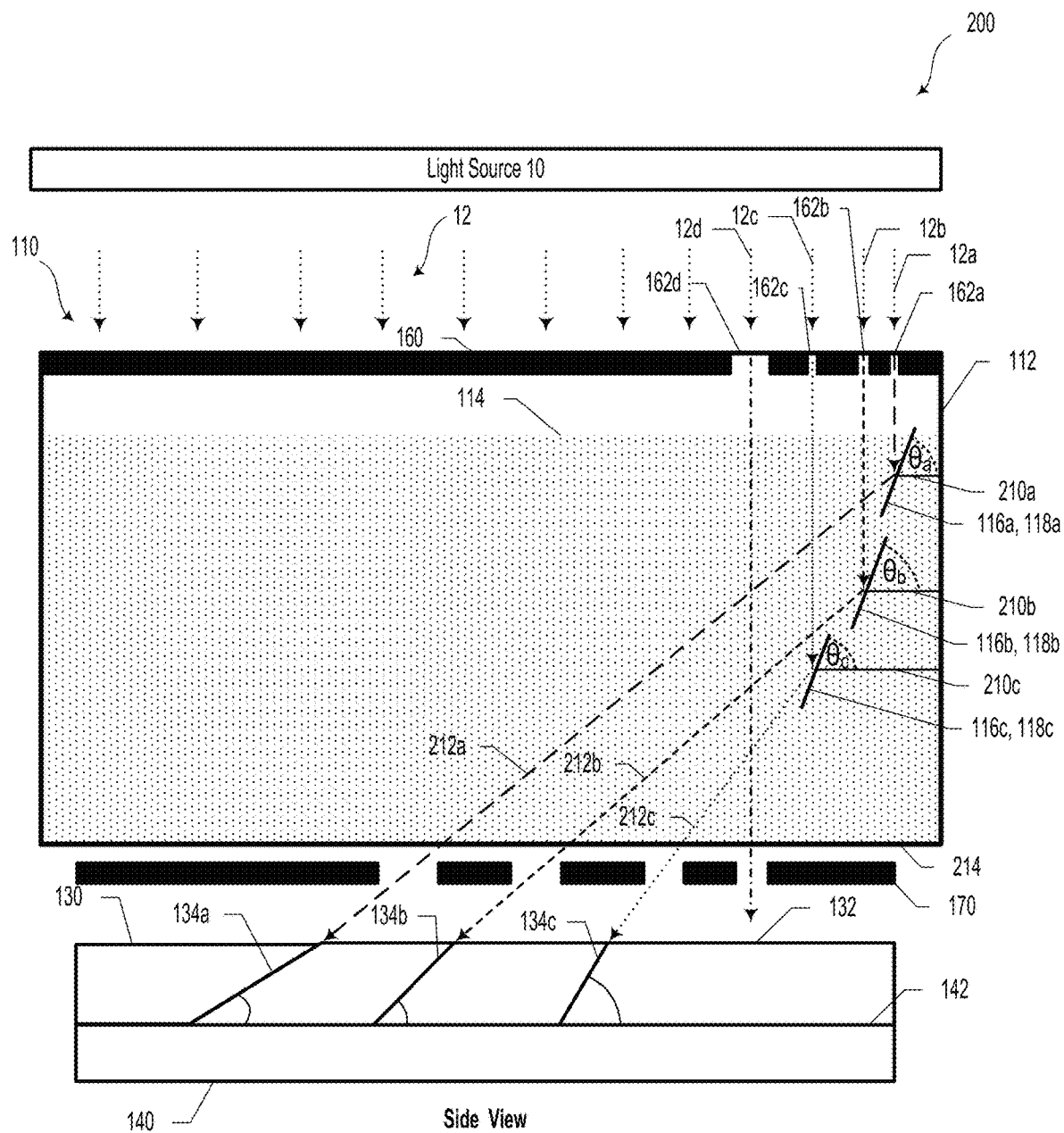
FIG. 2A illustrates a system, according to an example embodiment.

FIG. 2A illustrates a system 200, according to an example embodiment. The system 200 could be similar or identical to system 100, as illustrated and described in relation to FIG. 1. For example, a light source 10 could be configured to emit light 12 toward an optical component 110.

In an example embodiment, the light 12 could interact with an aperture mask 160. In such a scenario, light portions 12a, 12b, 12c, and 12d may pass substantially through respective openings 162a, 162b, 162c, and 162d in the aperture mask 160.

Light portion 12a could interact with reflective surface 116a, which may be arranged along a flat mirror portion 118a. Reflective surface 116a could be arranged at an angle $\theta_a$ with respect to support 210a or another reference plane of the container 112. In such a scenario, light portion 12a could be reflected from reflective surface 116a as reflected light 212a. Reflected light 212a may interact with photoresist material 130 along an angle (e.g., 42°) with respect to substrate 140 and first surface 142. In such a scenario, reflected light 212a may expose the photoresist material 130 with UV light so as to cross-link the photoresist material 130. In so doing, the reflected light 212a may help form angled structure 134a within the context of a photoresist exposure and development process.

Likewise, light portions 12b and 12c may interact with reflective surfaces 116b and 116c, respectively. For example, light portion 12b could interact with reflective surface 116b, which could be arranged along a flat mirror portion 118b. In such a scenario, reflective surface 116b could be arranged at an angle θb with respect to support 210b or another reference plane or surface of the container 112. In an example embodiment, light portion 12b could be reflected from reflective surface 116b as reflected light 212b. Reflected light 212b may interact with photoresist material 130 along an angle (e.g., 45°) with respect to substrate 140 and first surface 142. In examples, reflected light 212b may expose the photoresist material 130 with UV light, cross-linking it. As such, the reflected light 212b may form, at least in part, angled structure 134b within the context of a photoresist exposure and development process.

Additionally or alternatively, light portion 12c could interact with reflective surface 116c, which could be arranged along a flat mirror portion 118c. In such a scenario, reflective surface 116c could be arranged at an angle $\theta_c$ with respect to support 210c or another reference plane or surface of the container 112. In an example embodiment, light portion 12c could be reflected from reflective surface 116c as reflected light 212c. Reflected light 212c may interact with photoresist material 130 along an angle (e.g., 48°) with respect to substrate 140 and first surface 142. In examples, reflected light 212c may expose the photoresist material 130, cross-linking it. In such a manner, the reflected light 212c may help, at least in part, form angled structure 134c in a photoresist exposure and development process.

In some embodiments, light portion 12d could pass through the aperture plate 160 via opening 162d. In such cases, light portion 12d could pass directly (e.g., vertically or straight) toward the photoresist material 130 and substrate 140. In examples, light portion 12d could expose the photoresist along a vertical (e.g., normal) angle with respect to the substrate 140. In such scenarios, light portion 12d could assist to form vertical structures 132 in the photoresist material 130 upon a photoresist development process.

While not illustrated, the optical component 110 may also include structures and/or devices for removing stray light. The structures may be dark baffles that are arranged in the optical component 110 in order to remove stray light (e.g., light reflected back into the optical component 110).

In some examples, an exterior of the container 112 may include plumbing fittings for filling and draining the light-coupling material 114 from the container 112. In another example embodiment, the container 112 may include fittings for components (e.g., filters, vacuum devices, etc.) to remove air bubbles or other types of gas bubbles or impurities. Furthermore, in some embodiments, at least a portion of each of the reflective surface (e.g., reflective surfaces 116a, 116b, and/or 116c) may be masked in order to improve directivity of the light reflected off of the reflective surfaces.

In other embodiments, the system 200 may also include mechanical and/or optical features for aligning the substrate 140 to the optical component 110 and/or the light source 10. In an example, the system 200 may include stages, fixtures, optical devices (e.g., magnifying devices), and/or image capturing devices (e.g., cameras) that may be used to align the substrate 140. In an implementation, the system 200 may include a linear stage that may be used to bring the substrate 140 in contact with an exit surface (e.g., bottom surface 214) with a light-coupling material filling a gap between the exit surface and the substrate 140. Additionally, the exit surface may include fiducials that could be used to align the substrate 140. For example, in-plane and rotation alignment may be achieved by aligning fiducial marks on the exit surface with features on the photomask 170. In an implementation, two pairs of features may be observed simultaneously with one or more cameras arranged to image fiducial marks on the photomask 170 with respect to fiducial marks on the container 112.

Figure 2B:
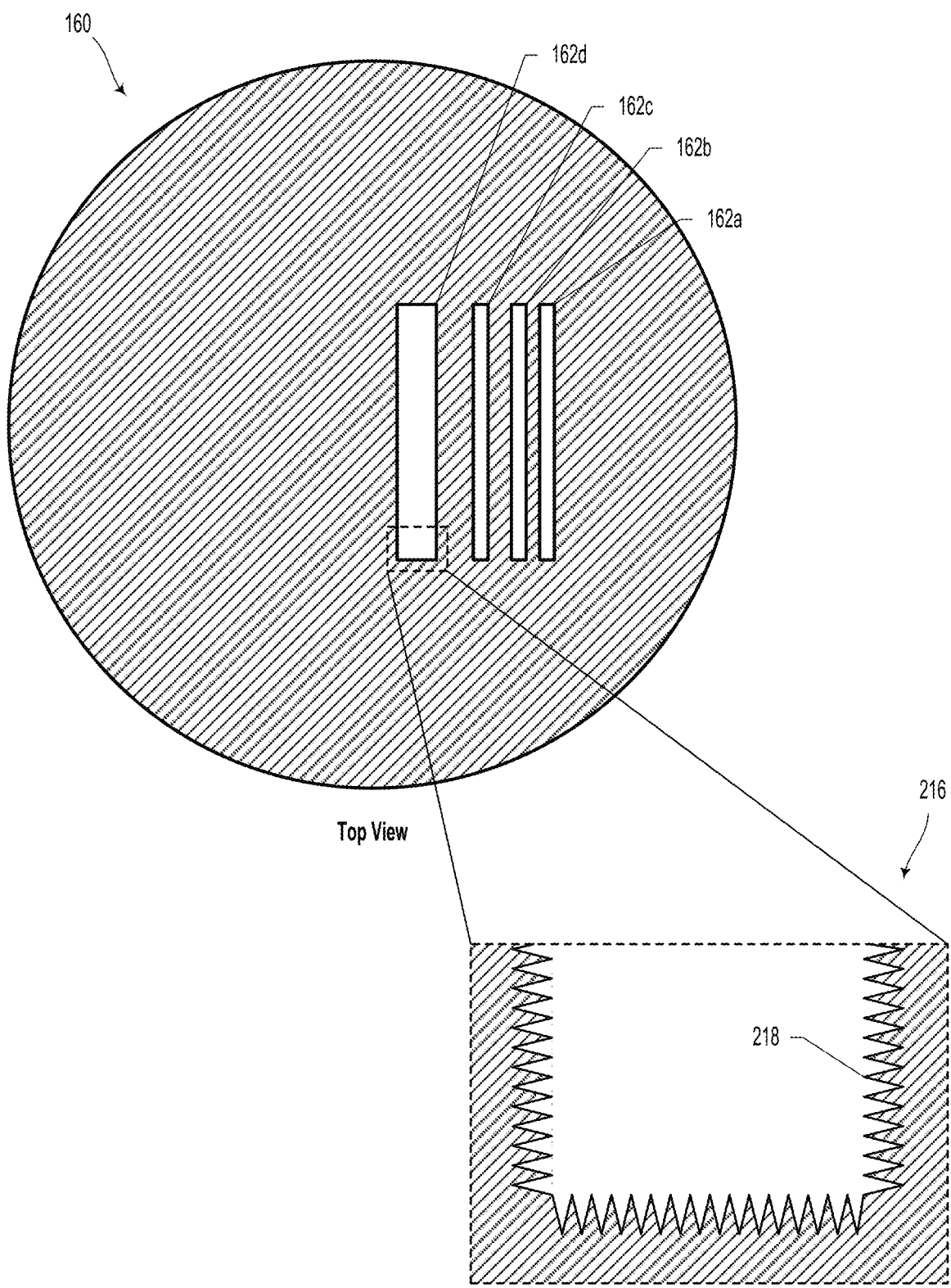
FIG. 2B illustrates an aperture mask of the system of FIG. 2A, according to an example embodiment.

FIG. 2B illustrates a top view of an aperture mask 160 of the system 200 of FIG. 2A, according to an example embodiment. The aperture mask 160 may include opaque features and transparent features that allow light to pass through. For example, the aperture mask 160 could include a plurality of openings 162. For example, the openings 162 could include several long, narrow transparent (or clear) openings 162a, 162b, 162c, and 162d in the aperture mask 160.

In some cases, it may be desirable to overlap normal and angled illumination fields at the photoresist material 130 while maintaining a substantially uniform illumination intensity in overlapping transition region. In such scenarios, the photoresist material 130 could be illuminated such that the intensity of one field increases along a direction which the intensity of the adjacent field decreases. In such a fashion, as illustrated in inset 216, some or all edge features of aperture mask 160 could include one or more gradient neutral density filters. In some embodiments, such filters may be configured to blur out to a gradient intensity pattern at the photoresist material 130.

For example, an optical gradient intensity filter could be implemented with an opaque fine saw tooth pattern 218 along the edges of the aperture mask opening 162. Additionally or alternatively, the optical gradient intensity filter could be provided by modulating a size and/or density of opaque circles (e.g., stippling or "polka dots") along an edge feature of aperture mask 160. Embodiments could utilize these saw tooth and/or polka dot patterns mechanically as part of the edge of aperture mask 160 or as part of a separate photomask aligned to the aperture mask 160 or fiducial marks on the substrate 140. While FIG. 2B illustrates all sides of opening 162d as having a saw tooth pattern, other designs are possible. For example, in some embodiments, only one long side of the opening could have the sawtooth pattern. In such scenarios, the other sides of the opening could be straight (e.g., unpatterned).

Figure 2C:
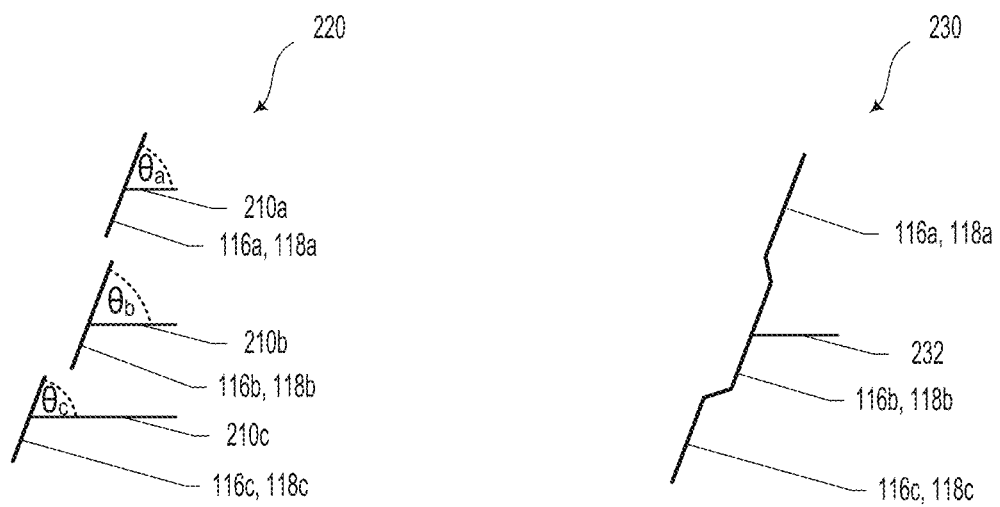
FIG. 2C illustrates various reflective surface types, according to example embodiments.
Figure 2C:
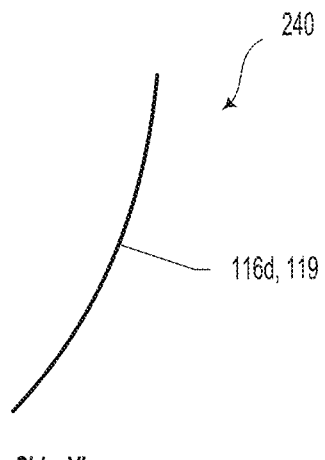

FIG. 2C illustrates various reflective surface types 220, 230, and 240, according to example embodiments. Reflective surface type 220 could include a plurality of reflective surfaces 116a, 116b, and 116c. In such a scenario, the reflective surfaces could include a first flat mirror portion 118a, a second flat mirror portion 118b, and a third flat mirror portion 118c. Each of the flat mirror portions could be physically separated from one another.

The reflective surfaces 116a, 116b, and 116c could be mounted to the container by way of one or more supports 210a, 210b, and 210c. The supports 210a, 210b, and 210c could be fixed so as to maintain an orientation of the reflective surfaces 116a, 116b, and 116c at a predetermined angle or predetermined orientation. Additionally or alternatively, the supports 210a, 210b, and 210c could be adjustable to adjust the orientation of the reflective surfaces 116a, 116b, and 116c. For example, one or all of supports 210a, 210b, and 210c could be configured to be adjustable by way of a piezoelectric actuator, a stepper motor, or another type of angle-adjustment apparatus. It will be understood that there are many other ways to adjust an orientation of the reflective surface 116a, 116b, and 116c, all of which are contemplated and possible within the context of the present disclosure.

Reflective surface type 230 could include a continuous mirror made up of first flat mirror portion 118a, a second flat mirror portion 118b, and a third flat mirror portion 118c that could be physically coupled together by way of a continuous mirror surface or another type of coupling structure. In other words, in some embodiments, the mirror portions could be linked to one another and attached to the container 112 by way of support 232. In such a scenario, the mirror portions need not be individually supported or mounted. Instead, a single continuous mirror could be physically supported by a single support (e.g., support 232).

Reflective surface type 240 could include a curved mirror portion 119 with a corresponding curved reflective surface 116d. The curved mirror portion 119 could be curved in an axially symmetric manner (e.g., having a cylindrical curvature). However, in other embodiments, curved mirror portion 119 could be curved according to another shape.

Figure 2D:
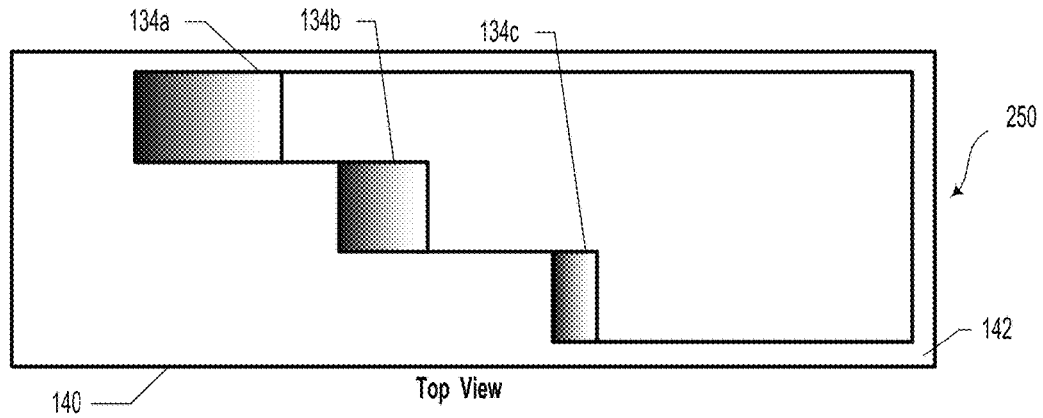
FIG. 2D illustrates a photoresist structure, according to an example embodiment.
Figure 2D:
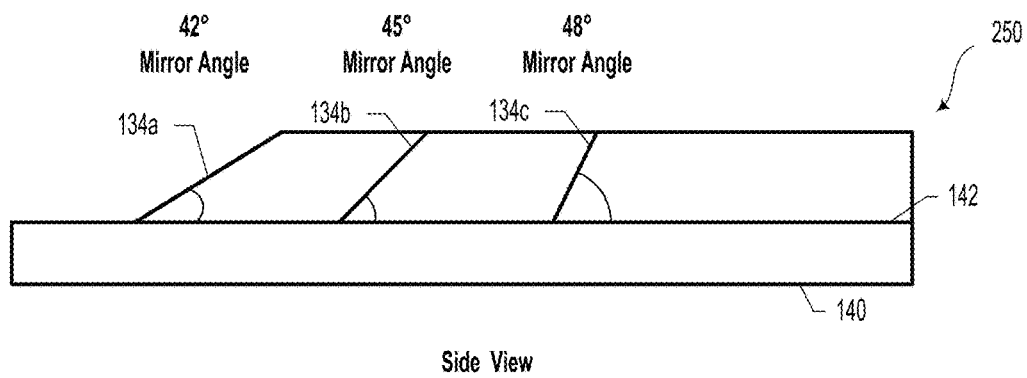
Figure 2D:
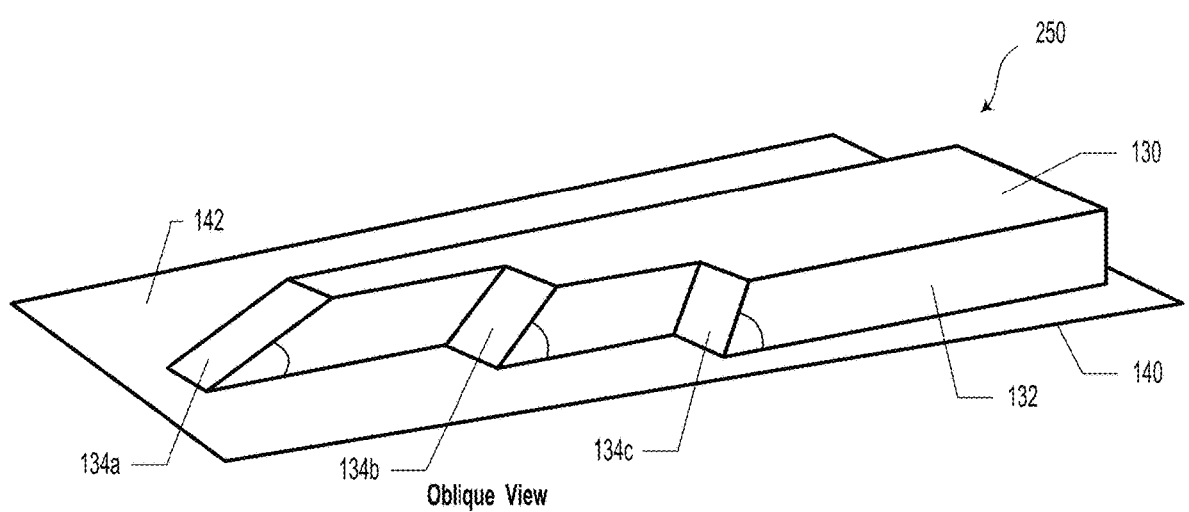

FIG. 2D illustrates a photoresist structure 250, according to an example embodiment. FIG. 2D illustrates the photoresist structure 250 upon development of the photoresist material 130. In particular, after exposure of the angled structures 134a, 134b, 134c, and 132, various portions of the photoresist material 130 may be removed to reveal surfaces of the photoresist structure 250. In some embodiments, the angled structures 134a, 134b, and 134c could have different mirror angles with respect to the first surface 142 of the substrate 140. While FIG. 2D illustrates the photoresist structure 250 as having a certain shape, other shapes are possible and contemplated herein.

Figure 2E:
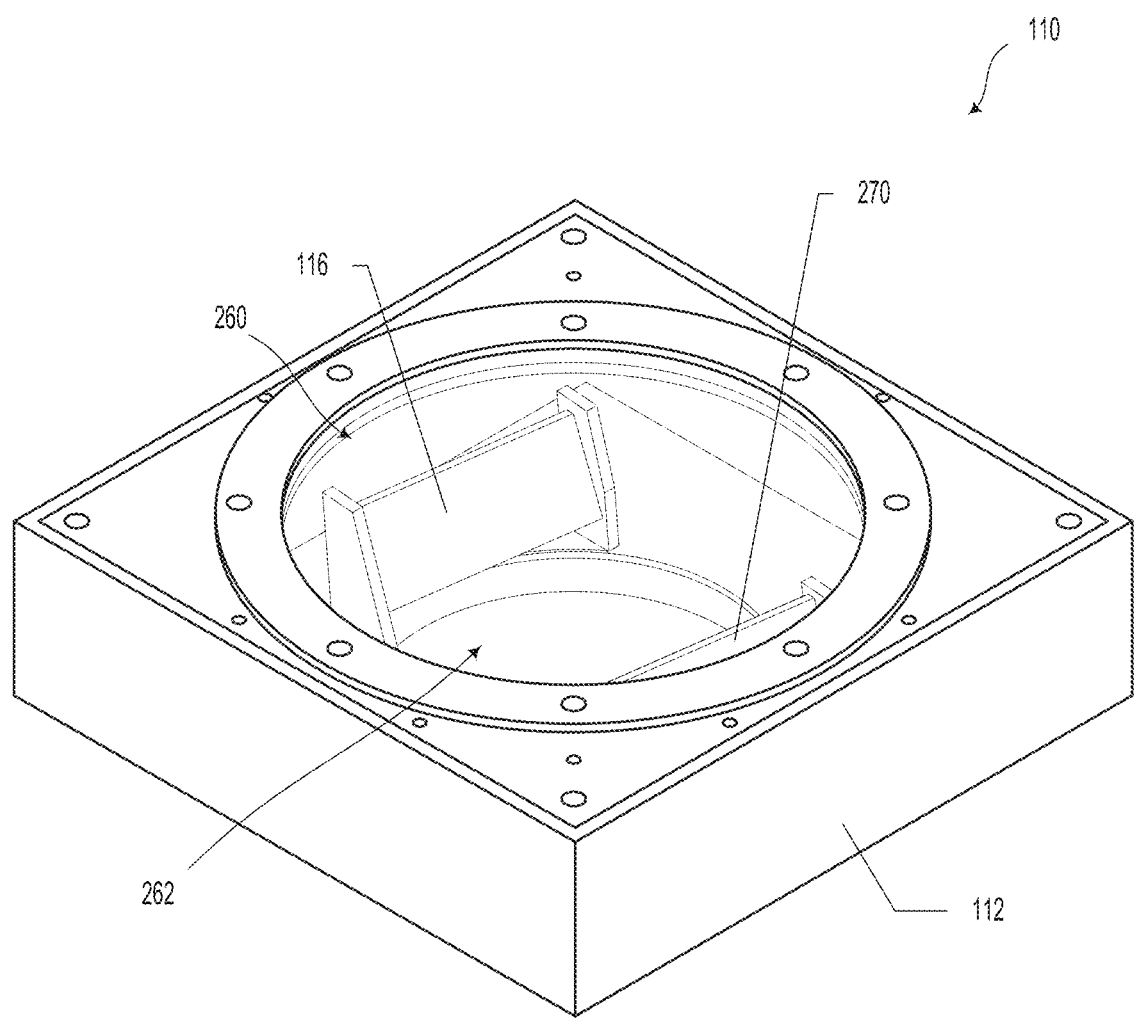
FIG. 2E illustrates an optical component, according to an example embodiment.

FIG. 2E illustrates an optical component 110, according to an example embodiment. FIG. 2E is an oblique view of a light input side of the optical component 110. The optical component 110 could include a container 112. The optical component 110 could include a first reflective surface 116 and a second reflective surface 270. The optical component 110 could also include a transparent top window 260 and a transparent bottom window 262.

Figure 2F:
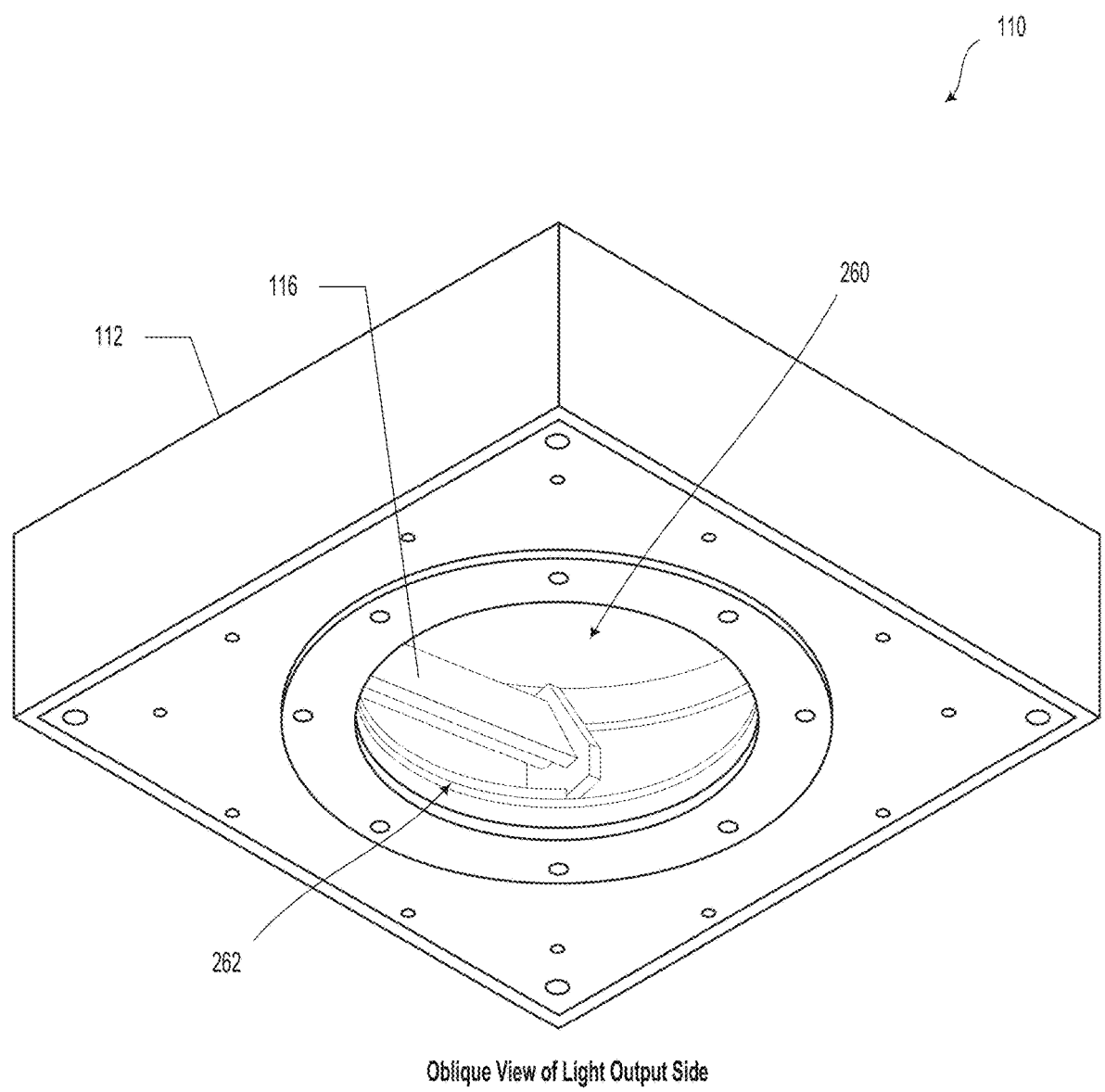
FIG. 2F illustrates an optical component, according to an example embodiment.

FIG. 2F illustrates an optical component 110, according to an example embodiment. FIG. 2F is an oblique view of a light output side of the optical component 110. The optical component 110 could include a container 112. As illustrated in FIG. 2F, the optical component 110 could include a first reflective surface 116, a transparent top window 260, and a transparent bottom window 262.

Figure 3A:
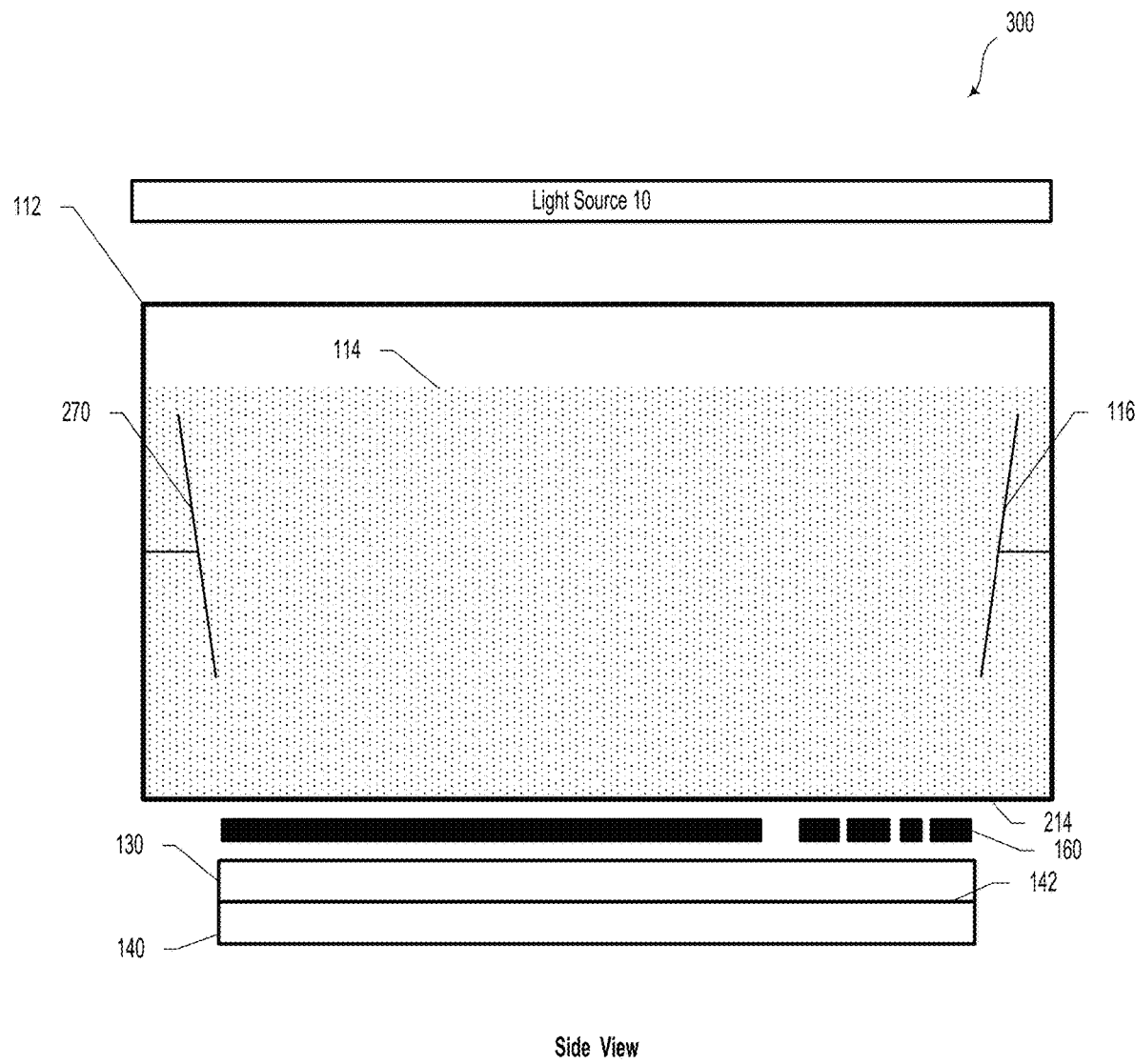
FIG. 3A illustrates a system, according to an example embodiment.

FIG. 3A illustrates a system 300, according to an example embodiment. System 300 could be similar or identical to system 100 and/or system 200, as illustrated and described in relation to FIGS. 1 and 2A. For example, the system 300 could include a light source 10 and a container 112 filled, at least partially, with light-coupling material 114. The system 300 also could include a first reflective surface 116 and a second reflective surface 270.

In an example embodiment, system 300 includes an aperture mask 160 that could be arranged below an exit surface (e.g., bottom surface 214) of the container 112. In such a scenario, light emitted from the light source 10 could be reflected from the first reflective surface 116 and the second reflective surface 270 and impinge on the aperture mask 160. A portion of the reflected light may be transmitted through the openings 162 in the aperture mask 160.

The light transmitted through the aperture mask 160 could expose the photoresist material 130, which could overlay a first surface 142 of a substrate 140. As described herein, the angles of the transmitted light could be controlled or manipulated so as to expose angled structures in the photoresist material 130.

Figure 3B:
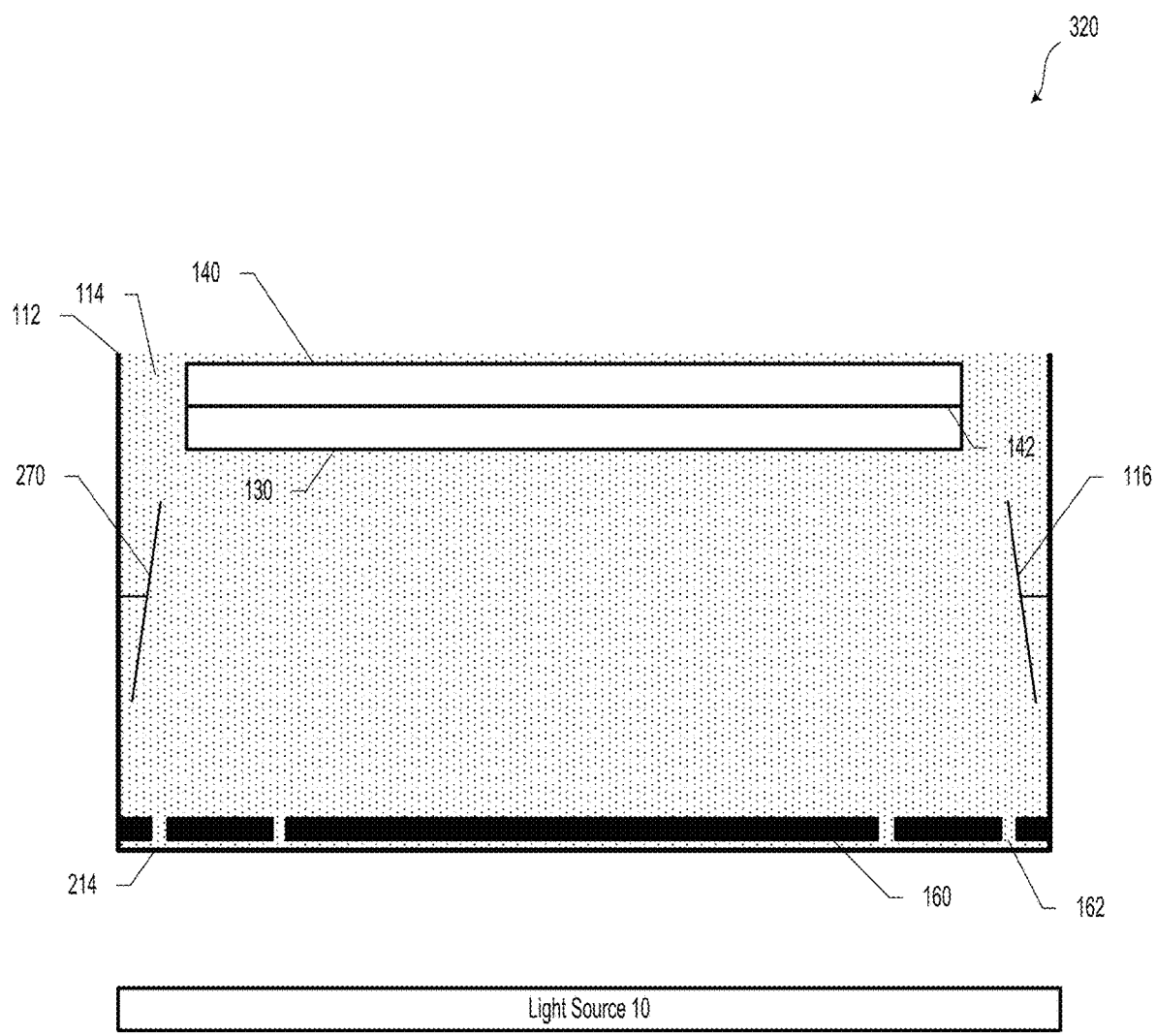
FIG. 3B illustrates a system, according to an example embodiment.

FIG. 3B illustrates a system 320, according to an example embodiment. System 320 could be similar or identical to system 100 and/or system 200, as illustrated and described in relation to FIGS. 1 and 2A. For example, the system 320 could include a light source 10 and a container 112 filled, at least partially, with light-coupling material 114. The system 320 also could include a first reflective surface 116 and a second reflective surface 270.

In some embodiments, system 320 may include the light source 10 being arranged below (e.g., underneath) the container 112. As such, light emitted from the light source 10 may be directed upward toward a bottom surface 214 of the container 112.

In such scenarios, system 320 includes an aperture mask 160 that could be arranged within the container 112 along a bottom interior surface of the container. In such a scenario, light emitted from the light source 10 could be incident on the aperture mask 160 and be transmitted toward the reflective surfaces 116 and/or 270 by way of the openings 162. A portion of the transmitted light may be reflected by reflective surfaces 116 and/or 270 so as to expose the photoresist material 130, which could overlay a first surface 142 of a substrate 140.

Figure 3C:
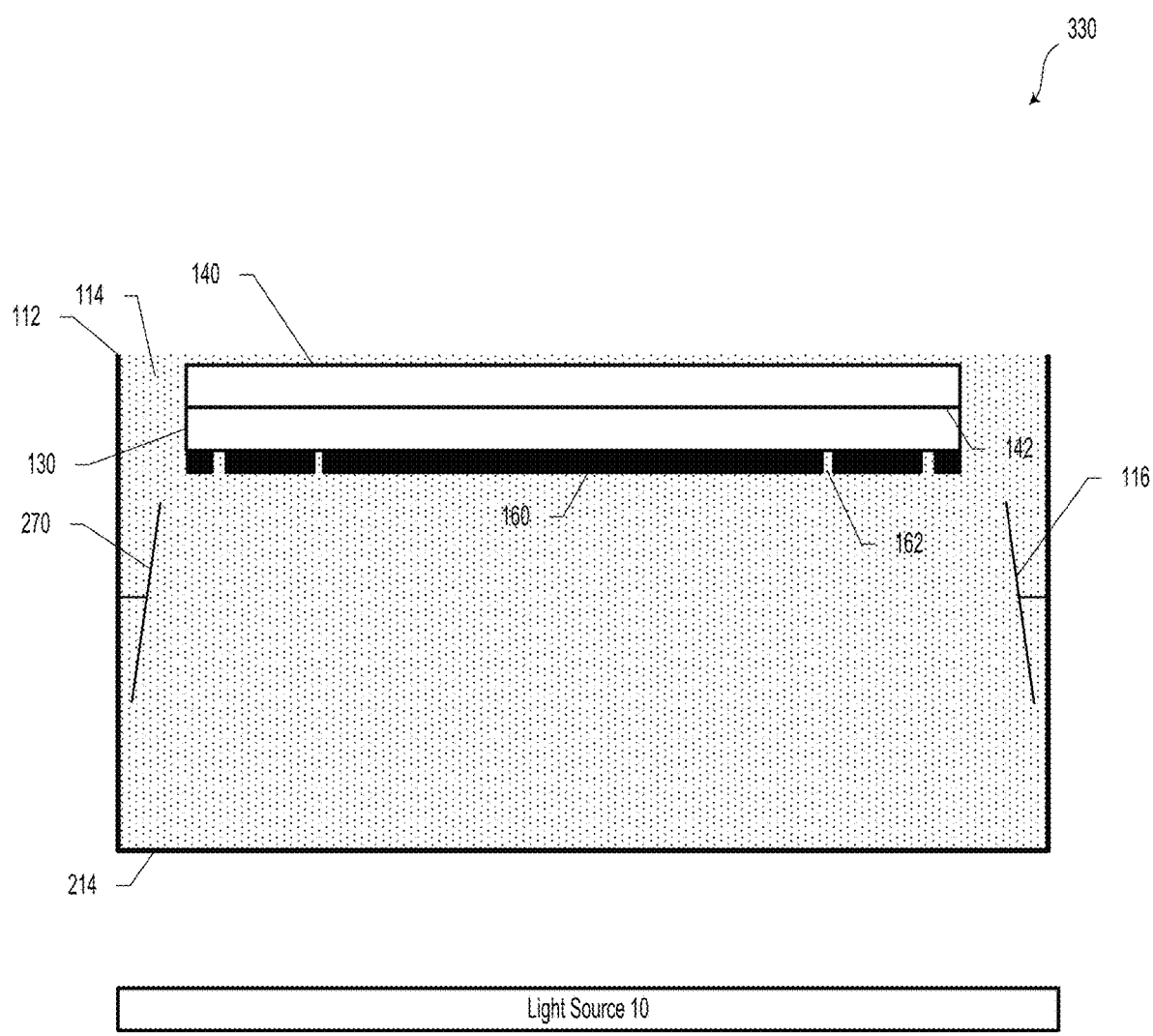
FIG. 3C illustrates a system, according to an example embodiment.

FIG. 3C illustrates a system 330, according to an example embodiment. For example, system 330 could be similar or identical to system 100 and/or system 200, as illustrated and described in relation to FIGS. 1 and 2A. For example, the system 330 could include a light source 10 and a container 112 filled, at least partially, with light-coupling material 114. The system 330 also could include a first reflective surface 116 and a second reflective surface 270.

In some embodiments, system 330 may include the light source 10 being arranged below (e.g., underneath) the container 112. As such, light emitted from the light source 10 may be directed upward toward a bottom surface 214 of the container 112.

In such scenarios, system 330 includes an aperture mask 160 that could be arranged in the container 112 and in proximity to the photoresist material 130. For example, the aperture mask could be in soft or hard contact with the photoresist material 130. In such a scenario, light emitted from the light source 10 could be incident on the reflective surfaces 116 and/or 270. Reflected and transmitted light would be incident upon the aperture mask 160 and be transmitted toward the photoresist material 130 by way of the openings 162 to expose the photoresist material 130, which could overlay a first surface 142 of a substrate 140.

III. Example Optical Systems

Figure 4A:
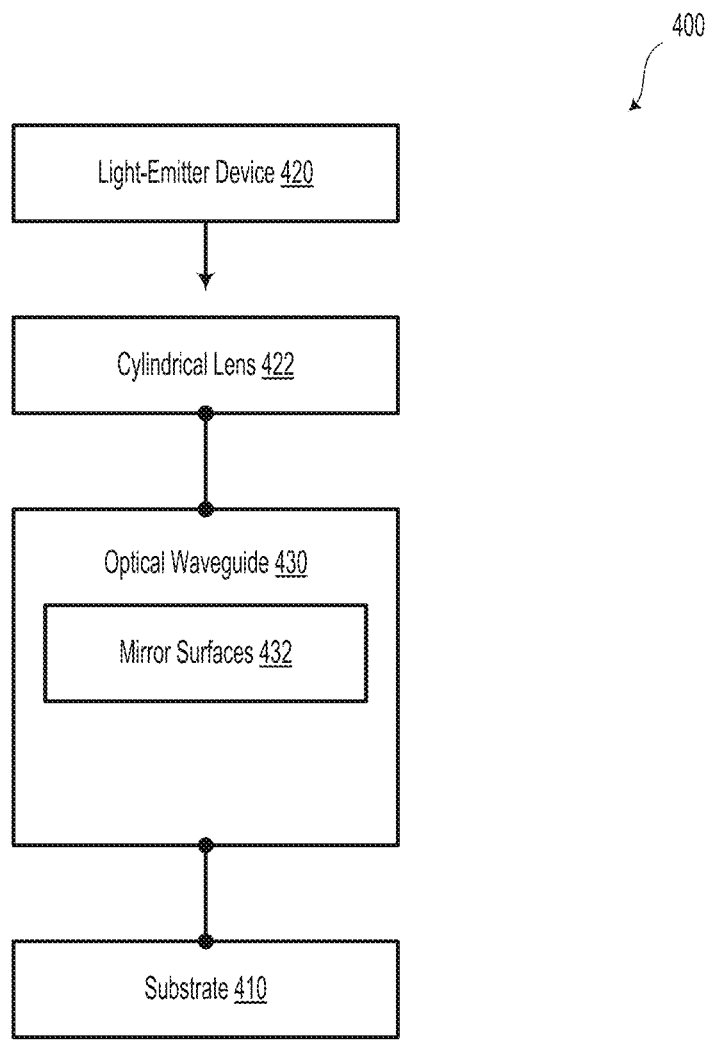
FIG. 4A illustrates an optical system, according to an example embodiment.
Figure 4B:
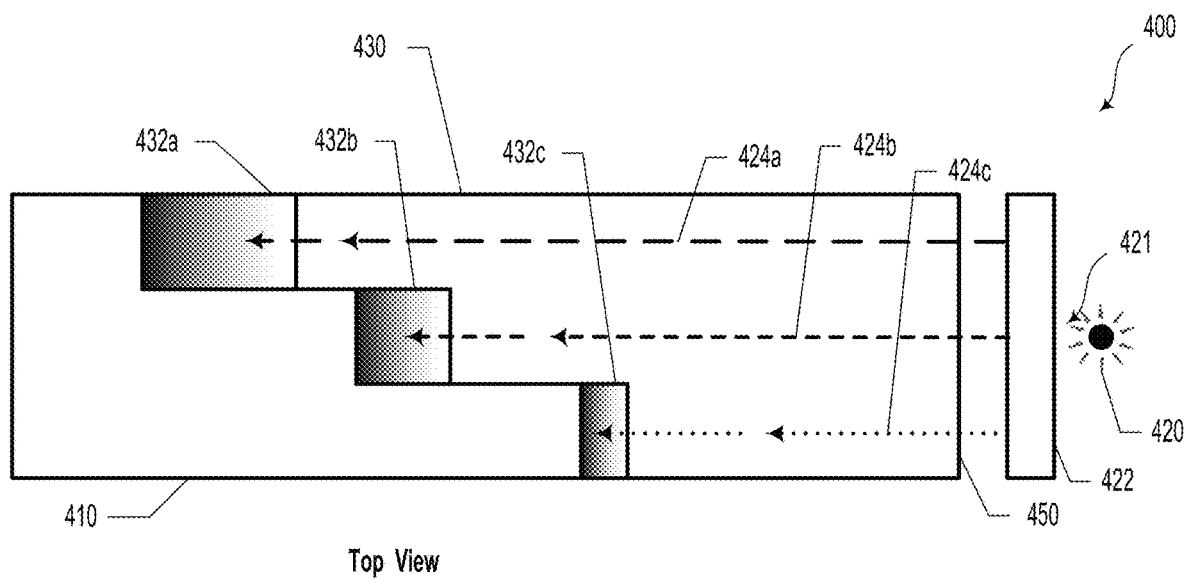
FIG. 4B illustrates an optical system, according to an example embodiment.
Figure 4B:
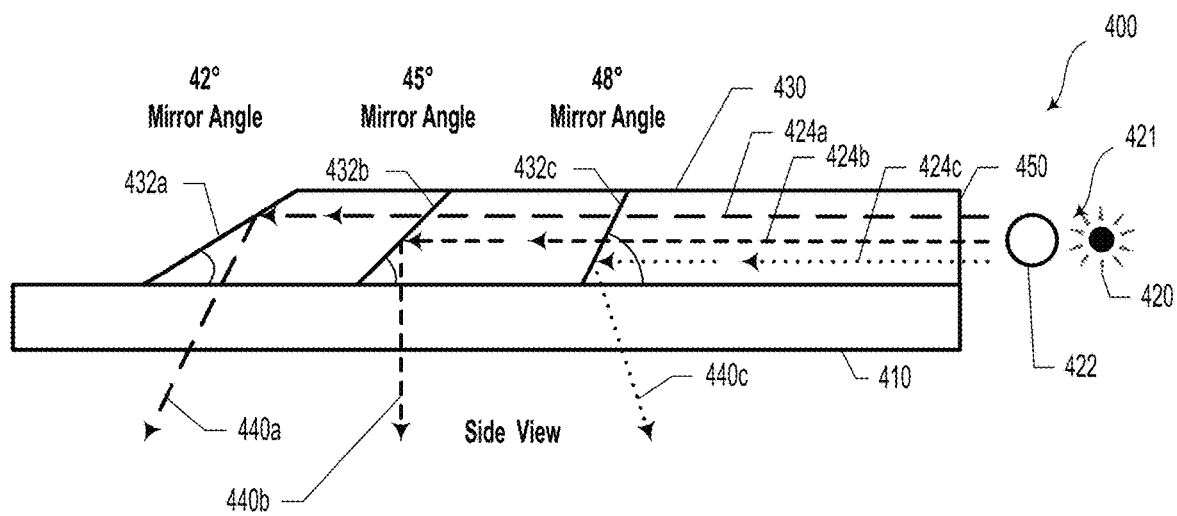

FIGS. 4A and 4B illustrate an optical system 400 and portions thereof, according to an example embodiment. Optical system 400 may be a compact LIDAR system that incorporates optical light guide elements. Such a LIDAR system may be configured to provide information (e.g., point cloud data) about one or more objects (e.g., location, shape, etc.) in a given environment. In an example embodiment, the LIDAR system could provide point cloud information, object information, mapping information, or other information to a vehicle. The vehicle could be a semi- or fully-automated vehicle. For instance, the vehicle could be a self-driving car, an autonomous drone aircraft, an autonomous truck, or an autonomous robot. Other types of vehicles and LIDAR systems are contemplated herein.

FIG. 4A illustrates a schematic block diagram of the optical system 400, according to an example embodiment. The optical system 400 includes a substrate 410, a light-emitter device 420, and an optical waveguide 430. In some embodiments, the light-emitter device 420 could include a laser assembly that includes one or more laser bars. Additionally or alternatively, the optical system 400 could include a cylindrical lens 422. In some examples, the cylindrical lens 422 could include an optical fiber.

The optical waveguide 430 is arranged along a surface of the substrate 410. The optical waveguide 430 includes at least one mirror surface 432. The optical waveguide 430 is configured to guide light emitted by the light-emitter device 420. Such light may be guided within at least a portion of the optical waveguide 430 via total internal reflection.

In some embodiments, the at least one mirror surface 432 of the optical waveguide 430 may include a reflective material, such as a metallic coating. In some embodiments, the metallic coating may include one or more metals such as titanium, platinum, gold, silver, aluminum, and/or another type of metal. In other embodiments, the at least one mirror surface 432 may include a dielectric coating and/or a dielectric stack.

In such scenarios, a portion of the guided light interacts with the mirror surface 432 so as to direct reflected light into an environment of the optical system 400. In some embodiments, the mirror surface 432 could be arranged at at least one of 42 degrees, 45 degrees, or 48 degrees with respect to the substrate 410.

The light-emitter device 420 may be configured to emit light towards a cylindrical lens 422, which may help focus, defocus, direct, and/or otherwise couple the emitted light into the optical waveguide 430.

Optical system 400 is one of a variety of different optical systems that may include light guides such as optical waveguide 430 formed from a photoresist material 130 or other optical materials. In an example embodiment, optical waveguide 430 could be coupled to a transparent substrate. In such scenarios, the mirror surface(s) 432 could be configured to direct light emitted by the light-emitter device 420 towards the transparent substrate and thereafter into the environment of the optical system 400.

FIG. 4B illustrates a top view and side view of the optical system 400, according to an example embodiment. As illustrated in FIG. 4B, optical waveguide 430 could be similar or identical to photoresist structure 250 as illustrated and described in relation to FIG. 2D.

As an example, the optical waveguide 430 could include three mirror surfaces 432a, 432b, and 432c. The mirror surfaces 432a, 432b, and 432c could have different angles. For example, mirror surface 432a could be oriented at a 42° mirror angle with respect to the surface of substrate 410. Additionally or alternatively, mirror surface 432b could be oriented at a 45° mirror angle with respect to the surface of substrate 410. Yet further, mirror surface 432c could be oriented at a 48° mirror angle with respect to the surface of substrate 410. It will be understood that other mirror angles (e.g., between 30° and 60°) are possible and contemplated. Furthermore, it will be understood that while FIG. 4B illustrates a particular arrangement of mirror surfaces 432, it will be understood that other arrangements of the mirror surfaces 432 and other elements of the optical waveguide 430 are possible and contemplated.

In some embodiments, the optical system 400 could include a light-emitter device 420 and a cylindrical lens 422. The cylindrical lens 422 could be arranged between the light-emitter device 420 and an input surface 450 of the optical waveguide 430. The light-emitter device 420 could be configured to emit emitted light 421 toward the cylindrical lens 422.

For example, as illustrated in FIG. 4B, the light-emitter device 420 may emit emitted light 421, which may be coupled into the optical waveguide 430 via the input surface 450. In such a scenario, light portions 424a, 424b, and 424c may be reflected toward an environment via mirror surfaces 432a, 432b, and 432c, respectively. Reflected light portions 440a, 440b, and 440c could be outcoupled by way of the substrate 410, which may be substantially transparent. The reflected light portions 440a, 440b, and 440c may interact with objects in the environment (e.g., via reflection, absorption, and/or refraction).

Put another way, upon interacting with the cylindrical lens 422, various portions of the emitted light 421 could be coupled into the optical waveguide 430. For example, a first light portion 424a could interact with mirror surface 432a. In such a scenario, the first light portion 424a could be reflected from the mirror surface 432a, forming first reflected light 440a. Additionally, a second light portion 424b could interact with mirror surface 432b. In such a scenario, the second light portion 424b could be reflected from the mirror surface 432b, forming second reflected light 440b. Furthermore, a third light portion 424c could interact with mirror surface 432c. In such a scenario, the third light portion 424c could be reflected from the mirror surface 432c, forming second reflected light 440c.

As illustrated, first reflected light 440a, second reflected light 440b, and third reflected light 440c could be reflected at different angles with respect to the surface of the substrate 410. For example, first reflected light 440a, second reflected light 440b, and third reflected light 440c could be between ±6° with respect to the surface normal of the substrate 410. Other reflected angles are possible and contemplated.

IV. Example Methods

Figure 5:
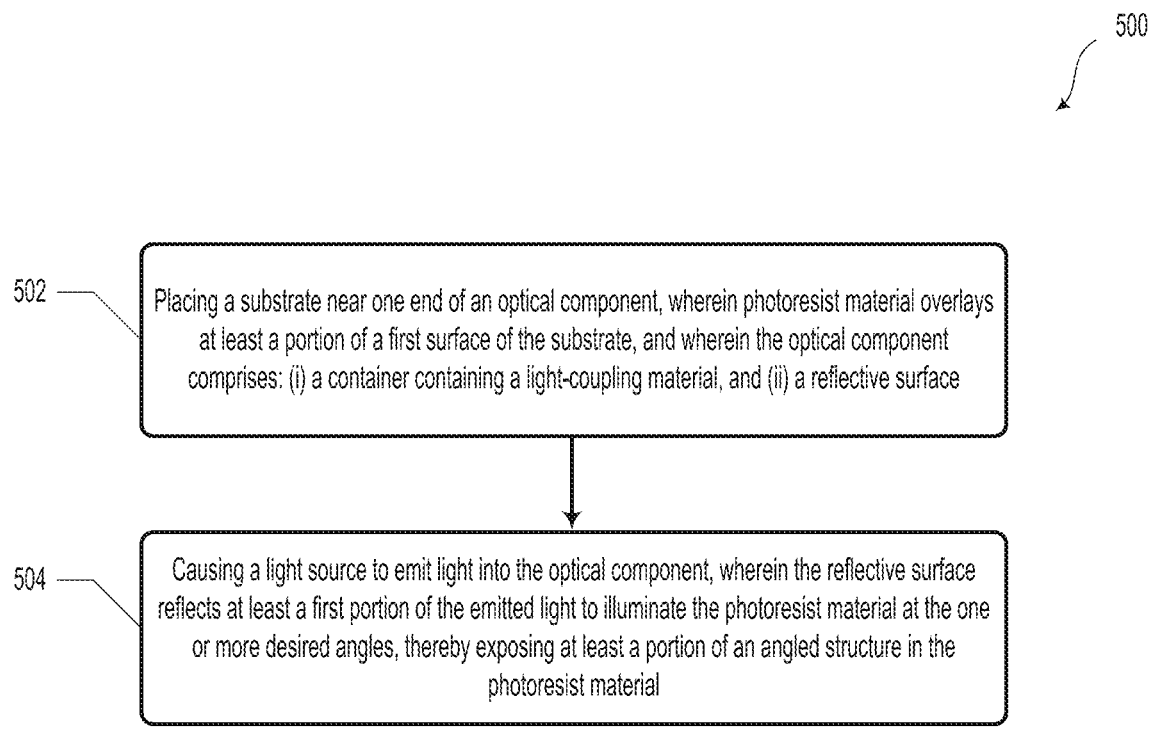
FIG. 5 illustrates a method, according to an example embodiment.

FIG. 5 illustrates a method 500, according to an example embodiment. It will be understood that the method 500 may include fewer or more steps or blocks than those expressly illustrated or otherwise disclosed herein. Furthermore, respective steps or blocks of method 500 may be performed in any order and each step or block may be performed one or more times. In some embodiments, some or all of the blocks or steps of method 500 may relate to elements of system 100 and/or optical system 400 as illustrated and described in relation to FIGS. 1, 4A, and 4B.

Block 502 includes placing a substrate near one end of an optical component, wherein photoresist material overlays at least a portion of a first surface of the substrate, and wherein the optical component comprises: (i) a container containing a light-coupling material, and (ii) a reflective surface.

Block 504 includes causing a light source to emit light into the optical component, wherein the reflective surface reflects at least a first portion of the emitted light to illuminate the photoresist material at the one or more desired angles, thereby exposing at least a portion of an angled structure in the photoresist material.

In some embodiments, the one or more desired angles could include one or more reflective surfaces being oriented at at least one of: 42 degrees, 45 degrees, and 48 degrees with respect to the first surface. It will be understood that other desired angles are contemplated and possible within the scope of the present disclosure.

In some examples, the method may include overlaying an aperture mask on or near a surface of the optical component. The aperture mask could include one or more openings, each opening corresponding to a respective desired structure in the photoresist material. At least a portion of the emitted light that is transmitted through each opening exposes the respective desired structure to which the opening corresponds.

In some embodiments, the aperture mask includes a first opening. In such scenarios, the first opening is configured to allow the first portion of the emitted light to interact with a first portion of the reflective surface. The first portion of the reflective surface is configured to redirect the first portion of the emitted light to expose the at least one angled structure.

In an embodiment, the method 500 may involve determining desired structures to fabricate, such as vertical structures and/or angled structures. Additionally, the method 500 may involve determining parameters of the desired structures. For example, the method 500 may involve determining dimensions of the desired structures. Additionally, for the desired angled structures, the method 500 may involve determining a desired slope angle. For example, the desired slope angle may be between 30-60 degrees with respect to a substrate surface.

As explained above, the desired slope angle of the angle structures may determine the mirror orientation angles. Accordingly, the method 500 may also involve determining the mirror orientation angles $\theta_a$, $\theta_b$, which may be determined using Snell's law. Snell's law states that a ratio of the sines of the angles of incidence and refraction is equivalent to the reciprocal of a ratio of the indices of refraction, which is represented by the following formula:

$$\frac{\sin \theta_2}{\sin \theta_1} = \frac{n_1}{n_2} \quad (1)$$

The desired angle of refraction in the photoresist material (e.g., photoresist material 130) ($\theta_2$), the refractive index of the light-coupling material (e.g., light-coupling material 114) ($n_1$), and the refractive index of the photoresist material ($n_2$) are known and may be used to calculate a desired angle of incidence. For example, the angle of incidence may be within an angle range between 15 to 45 degrees (inclusive) from normal incidence. It will be understood that other angles are possible and dynamically varying angles of incidence are possible as well.

Based on the angle of incidence, the mirror orientation angles (e.g., angles $\theta_a$, $\theta_b$, and/or $\theta_c$ as illustrated and described in relation to FIG. 2A) may be calculated. In particular, the angles may be calculated such that the light reflected by the reflective surface(s) may be incident on the photoresist material with the desired angle of incidence. Once the angles are calculated, the method 500 may also involve adjusting the adjustable coupling components (e.g., supports 210a, 210b, and/or 210c) such that the reflective surfaces are positioned at the desired angles.

The method 500 may also involve providing a wafer that includes the substrate (e.g., substrate 140) that is overlaid with the photoresist material. In such scenarios, providing the substrate may involve preparing the photoresist material by depositing a photoresist onto the substrate 140 followed by baking the photoresist material. Additionally, providing the wafer may include disposing a photoresist material onto the wafer. Additionally, providing the wafer may involve aligning the wafer with the optical component. As explained herein, aligning the wafer may involve aligning fiducials on an exit surface (e.g., bottom surface 214) with features on a photomask (e.g., photomask 170).

The method 500 may also involve causing the light source to emit light directed towards the optical component. For example, the light source may emit light towards the optical component by way of a substantially uniform illumination intensity across a first surface of the optical component. In example systems where the light source is not positioned above the optical component, the light from the light source may be redirected towards the optical component via one or more optical elements (e.g., mirrors, light guides, etc.).

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. An optical system comprising:
a substrate;
a light-emitter device; and
an optical waveguide arranged along a surface of the substrate, wherein the optical waveguide comprises an input surface and a plurality of mirror surfaces, the plurality of mirror surfaces including at least a first mirror surface positioned at a first distance from the input surface and a second mirror surface positioned at a second distance from the input surface, wherein the optical waveguide is configured to guide light emitted by the light-emitter device from the input surface to each of the plurality of mirror surfaces, wherein a first portion of the guided light interacts with the first mirror surface so as to direct first reflected light out of the optical waveguide, wherein a second portion of the guided light interacts with the second mirror surface so as to direct second reflected light out of the optical waveguide, wherein the first mirror surface is arranged at a first angle with respect to the substrate, wherein the second mirror surface is arranged at a second angle with respect to the substrate, wherein the second angle is different than the first angle, and wherein the second distance is greater than the first distance.

2. The optical system of claim 1, wherein the first angle and the second angle are each between 30 degrees and 60 degrees with respect to the substrate.

3. The optical system of claim 1, wherein the optical waveguide comprises a photoresist material.

4. The optical system of claim 3, wherein the photoresist material comprises a polymeric photo-patternable material.

5. The optical system of claim 3, wherein the photoresist material comprises at least one of: SU-8 polymer, Kloe K—Cl negative photoresist, PHOTOPOSIT negative photoresist, or JSR negative tone THB photoresist.

6. The optical system of claim 1, further comprising a cylindrical lens, wherein the light-emitter device is configured to emit light toward the cylindrical lens, wherein upon interacting with the cylindrical lens, at least a portion of the emitted light is coupled into the optical waveguide.

7. The optical system of claim 6, wherein the cylindrical lens is configured to perform at least one of: focusing the emitted light, defocusing the emitted light, or directing the emitted light into the optical waveguide.

8. The optical system of claim 6, wherein the cylindrical lens comprises an optical fiber.

9. The optical system of claim 1, wherein the light-emitter device comprises a laser assembly having one or more laser bars.

10. The optical system of claim 1, wherein the plurality of mirror surfaces comprises a reflective material, wherein the reflective material comprises a metallic coating.

11. The optical system of claim 10, wherein the metallic coating comprises at least one of: titanium, platinum, gold, silver, or aluminum.

12. The optical system of claim 1, wherein the plurality of mirror surfaces comprises a reflective material, wherein the reflective material comprises a dielectric coating or a dielectric stack.

13. The optical system of claim 1, wherein the optical waveguide comprises a plurality of vertical structures and a plurality of angled structures, wherein each mirror surface of the plurality of mirror surfaces is disposed along a respective angled structure of the plurality angled structures.

14. The optical system of claim 13, wherein the plurality of vertical structures includes the input surface, wherein the light emitted by the light-emitter device is in-coupled into the optical waveguide by way of the input surface.

15. The optical system of claim 13, wherein the first mirror surface is disposed on a first angled structure of the plurality of angled structures, wherein the second mirror surface is disposed on a second angled structure of the plurality of angled structures, and wherein the plurality of vertical surfaces includes a first side surface extending between the input surface and the first angled structure and a second side surface extending between the first angled structure and the second angled structure.

16. The optical system of claim 1, wherein the optical waveguide is configured to guide at least a portion of the emitted light via total internal reflection.

17. The optical system of claim 1, wherein the substrate is optically transparent, wherein the substrate comprises a first surface and a second surface opposite the first surface, wherein the optical waveguide is arranged along the first surface, wherein the first reflected light and the second reflected light are transmitted through the second surface and thereafter into an environment of the optical system.

18. A compact lidar system comprising:
an optical system, wherein the optical system comprises:
a substrate;
a light-emitter device; and
an optical waveguide arranged along a surface of the substrate, wherein the optical waveguide comprises an input surface and a plurality of mirror surfaces, the plurality of mirror surfaces including at least a first mirror surface positioned at a first distance from the input surface and a second mirror surface positioned at a second distance from the input surface, wherein the optical waveguide is configured to guide light emitted by the light-emitter device from the input surface to each of the plurality of mirror surfaces, wherein a first portion of the guided light interacts with the first mirror surface so as to direct first reflected light out of the optical waveguide, wherein a second portion of the guided light interacts with the second mirror surface so as to direct second reflected light out of the optical waveguide, wherein the first mirror surface is arranged at a first angle with respect to the substrate, wherein the second mirror surface is arranged at a second angle with respect to the substrate, wherein the second angle is different than the first angle, and wherein the second distance is greater than the first distance,
wherein the compact lidar system is configured to obtain information about one or more objects in a given environment.

19. The compact lidar system of claim 18, wherein the first angle and the second angle are each between 30 degrees and 60 degrees with respect to the substrate.

20. The compact lidar system of claim 18, wherein the optical waveguide comprises a photoresist material.

* * * * *